United States Patent
Mann et al.

(10) Patent No.: US 10,492,336 B2
(45) Date of Patent: Nov. 26, 2019

(54) SUBRACK ASSEMBLY FOR ELECTRONIC EQUIPMENT

(71) Applicant: Pentair Technical Solutions GmbH, Straubenhardt (DE)

(72) Inventors: Dietmar Mann, Remchingen (DE); Oliver Kistner, Pforzheim (DE); Heinz Euchner, Birkenfeld (DE)

(73) Assignee: Schoff GmbH, Straubenhardt (DE)

( * ) Notice: Subject to any disclaimer, the term of this patent is extended or adjusted under 35 U.S.C. 154(b) by 19 days.

(21) Appl. No.: 15/729,429

(22) Filed: Oct. 10, 2017

(65) Prior Publication Data

US 2018/0103561 A1 Apr. 12, 2018

(30) Foreign Application Priority Data

Oct. 11, 2016 (EP) .................................. EP16193230

(51) Int. Cl.
*H05K 7/20* (2006.01)

(52) U.S. Cl.
CPC ..... *H05K 7/20727* (2013.01); *H05K 7/20145* (2013.01); *H05K 7/20581* (2013.01); *H05K 7/20736* (2013.01)

(58) Field of Classification Search
CPC ........... H05K 7/20727; H05K 7/20581; H05K 7/20736; H05K 7/20145
USPC .................................................... 361/679.46
See application file for complete search history.

(56) References Cited

U.S. PATENT DOCUMENTS

| | | | |
|---|---|---|---|
| 6,563,706 B1 | 5/2003 | Strickler | |
| 6,625,033 B1 * | 9/2003 | Steinman | H05K 7/20581 174/382 |
| 6,819,563 B1 * | 11/2004 | Chu | G11B 33/1406 165/104.33 |
| 7,492,591 B1 | 2/2009 | Aybay et al. | |
| 8,305,786 B2 | 11/2012 | Kawasaki | |
| 8,514,571 B2 | 8/2013 | Ji et al. | |
| 2003/0184968 A1 | 10/2003 | Steinman | |
| 2003/0224645 A1 * | 12/2003 | Smith | G06F 1/181 439/278 |
| 2005/0024825 A1 | 2/2005 | Smith et al. | |
| 2007/0274039 A1 | 11/2007 | Hamlin | |
| 2009/0190301 A1 * | 7/2009 | Huang | H05K 7/20736 361/679.46 |

(Continued)

OTHER PUBLICATIONS

Asis 6 Slot Advanced TCS 8U AC/DC Chassis data sheet; www.asis-pro.com; 2 pages.

*Primary Examiner* — Jacob R Crum
(74) *Attorney, Agent, or Firm* — Quarles & Brady LLP (57) ABSTRACT

A subrack assembly can be configured for use with a subrack that includes an installation space for electronic circuit boards, an air distribution duct, an air collecting duct, and a slot. A fan tray can be configured to be slidably and removably received in the slot and can include panel and support one or more electric fans. The panel of the fan tray can at least partly define a first air chamber within the fan tray, and, in cooperation with the subrack, can define a second air chamber within the subrack, with the panel separating the second air chamber from the first air chamber. The one or more electric fans can be configured to drive an air flow through the first and second air chambers, the air collecting duct, and the air distribution duct, to cool the electronic circuit boards within the installation space.

20 Claims, 5 Drawing Sheets

(56) References Cited

U.S. PATENT DOCUMENTS

| | | | |
|---|---|---|---|
| 2011/0116233 A1* | 5/2011 | Beaudoin | H05K 7/20581 |
| | | | 361/695 |
| 2013/0163190 A1* | 6/2013 | Farnholtz | H05K 7/20727 |
| | | | 361/679.46 |
| 2013/0309957 A1 | 11/2013 | Fleming et al. | |
| 2014/0078668 A1* | 3/2014 | Goulden | H05K 7/20736 |
| | | | 361/679.47 |
| 2016/0183413 A1 | 6/2016 | Roesner et al. | |
| 2016/0381836 A1* | 12/2016 | Hall | H05K 7/20718 |
| | | | 361/679.48 |

\* cited by examiner

SUBRACK ASSEMBLY FOR ELECTRONIC EQUIPMENT

CROSS-REFERENCE TO RELATED APPLICATIONS

This application claims priority to European Patent Application No. 16 193 230, filed with the European Patent Office on Oct. 11, 2016 and titled "Schublade," the entirety of which is incorporated herein by reference.

STATEMENT REGARDING FEDERALLY FUNDED RESEARCH OR DEVELOPMENT

Not applicable.

BACKGROUND

Embodiments of the invention relate to a subrack for the installation of electronic cards with a standardized circuit board format (e.g., according to the PICMG-Standard Advanced Telecom Computing Architecture ("ATCA")) for powerful communications servers.

In some configurations, if a relatively large number of circuit boards with many electronic components or modules is packed into a relatively small subrack, a relatively large amount of heat may have to be dissipated from the electronic circuit boards. Accordingly, heat management may be of particular importance for these and other systems. As one example, according to the specification PICMG 3.0, up to 450 watts per ATCA-board are allowable, which corresponds to more than 6 kilowatts of heat that needs to be dissipated in a subrack with 14 slots.

In some configurations, an ATCA-subrack can include electric fans, which are located below or above the installation space. Cool air from the environment can be thereby sucked-in through openings at the front of the rack and guided into the installation space, where it passes by the electronic circuit boards, in order to cool them. The resulting heated-up air can be subsequently blown out through openings at the back of the rack. In conventional arrangements, the electric fans can be combined into one horizontal fan tray, which can be pulled out of the rack for maintenance and repair purposes.

In some cases, an appropriately powerful ventilation system, including the associated air distribution components, can require a lot of space within a particular subrack. This can correspondingly limit the space that remains for the installation of electronic circuit boards, especially with regard to the actually usable height.

Further, in some conventional arrangements, server systems that include a number of electronic circuit boards and fans or fan trays for cooling can be supplied with electrical energy by means of separate sub-assemblies or modules. For example, power supply units ("PSUs") can supply the entire system with power, wherein the operating voltages can be continuously measured and monitored, in cooperation with one or more shelf managers. Such PSUs, which can be implemented with multiple redundancy for larger systems, may demand additional space, in particular height, which in turn may not be available as installation space for electronic cards.

U.S. Pat. No. 8,514,571 B2 describes a subrack for a horizontal mounting of electronic boards (i.e., a horizontal subrack). A ventilation box is arranged above and below an installation space for circuit boards. This box is divided by a partition wall into a right and a left chamber, in particular an air intake chamber for cool air intake and an air outlet chamber for heated exhaust air. An air intake for cool air is provided on the front side, and an air output for heated up waste air is provided on the rear panel. A fan unit with several electric fans is located behind the air intake. Air chambers are provided on the right and left side of the installation space, in particular an air distribution chamber for incoming cold air and an air collecting chamber for heated up air. These air chambers are connected to the intake chamber or to the outlet chamber of the ventilation box. Fresh air from the environment can thus be sucked in through the intake and be pushed downwards into the air distribution chamber. The cold air is deflected at a 90 degree angle into the horizontal direction, flows throughout the installation space and accumulates as heated up air in the air collecting chamber on the other side. From there the hot air is pushed upwards into the air outlet chamber and finally escapes through the air outlet into the surrounding environment.

SUMMARY

Some embodiments of the invention provide a subrack assembly for use with a subrack with an installation space for electronic circuit boards, where the subrack may include an air distribution duct, an air collecting duct separate from the air distribution duct, and at least one slot. At least one fan tray can include one or more electric fans and can be configured to be inserted into a corresponding one of the at least one slot of the subrack. At least one power supply unit can supply at least one of the electronic circuit boards and the one or more electric fans with electrical energy, and can form an integral part of the fan tray. The at least one fan tray, when inserted into the slot, can at least partly define an air intake chamber to receive air from outside the subrack assembly and an air outlet chamber to exhaust the air. The air intake chamber can be in fluid communication with the air distribution duct to direct the air towards the electronic circuit boards, to be heated. The air outlet chamber can be in fluid communication with the air collecting duct in order to dissipate the heated air.

Some embodiments of the invention provide a subrack assembly for electronic circuit boards. A subrack can enclose an installation space for the electronic circuit boards, and can include at least one slot separated from the installation space, at least one air distribution duct in fluid communication with the at least one slot, and at least one air collecting duct in fluid communication with the at least one slot. At least one fan tray can be configured to be slidably received in the at least one slot, with each of the at least one fan trays including one or more electric fans and a rear panel that at least partly defines a first air chamber in an internal area of the at least one fan tray. The rear panel, when the at least one fan tray is slidably received in the at least one slot, can define, in cooperation with the subrack, a second air chamber outside of the at least one fan tray. The one or more electric fans can be thereby disposed to drive an air flow along a flow path through the second air chamber, the at least one air distribution duct, the at least one air collecting duct, and the first air chamber, to cool the electronic circuit boards within the installation space.

Some embodiments of the invention provide a subrack assembly for use with a subrack that includes an installation space for electronic circuit boards, an air distribution duct, an air collecting duct separate from the air distribution duct, and a slot. A fan tray can include a front side, a rear panel, and a side panel. One or more electric fans can be supported by the fan tray. The fan tray can be configured to be slidably and removably received in the slot. The front side, rear panel, and side panel can at least partly define a first air chamber within the fan tray. The rear panel, in cooperation with the subrack, can define a second air chamber within the subrack, with the rear panel separating the second air chamber from the first air chamber. The one or more electric fans can be configured to drive an air flow through the first and second air chambers, the air collecting duct, and the air distribution duct, to cool the electronic circuit boards within the installation space.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

As used herein, unless otherwise specified or limited, the phrases "at least one of A, B, and C," "one or more of A, B, and C," and the like, are meant to indicate A, or B, or C (individually or plurally), or any combination of A, B, and/or C (individually or plurally), including one or more instances of A (or members of a category described by A), one or more of instances of B (or members of a category described by B), and/or one or more of instances of C.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Generally, embodiments of the invention can provide components of a high-performance architecture that is scalable, and which can distinguish itself by means of a high functional density while needing relatively little space.

In some embodiments, one technical issue that is addressed stems from the conflict of objectives in providing a maximum installation space for electronic cards in a subrack of a given size, especially with a certain standardized height, while also in accommodating a sufficient number of electric fans for an effective cooling, as well as the necessary power supply for the entire system.

In addressing this issue, for example, a subrack according to an embodiment of the invention can include a fan tray that does not only include electric fans, but also at least one power supply as a built-in component. The height for the fan tray which is "lost" anyway, from a certain perspective, can thus be used for accommodating a power supply in accordance with the invention, which otherwise would have required additional installation space. In this way, for example, the overall height of the fully equipped subrack with electronic cards, fans and power supply is significantly reduced, at least by the height of a power supply unit.

In some embodiments, the fan unit can be designed as interchangeable tray by way of a drawer, thereby helping to ensure appropriate access to the integrated power supply. If a fault occurs or for maintenance purposes, for example, the fan tray with the integrated PSU can be pulled out of the rack, in order to access the power supply unit.

In some embodiments, to arrange the air intake openings and the air outlet openings on the same level, the rack slot that accommodates the fan tray can be divided into an air intake chamber for the incoming cold air and an air outlet chamber for heated up exhaust air. This can be accomplished, for example, by providing the fan tray with a rear panel that serves as a space divider or as a dividing element.

In some embodiments, it may be particularly advantageous if the fan tray features a layout in the form of a right-angled triangle whose hypotenuse is formed by the rear panel. In this way, for example, substantially triangular and approximately equally sized chambers for the air intake and air outlet are thus formed.

In some embodiments, the power supply unit that is integrated into the fan tray can be arranged within the air intake chamber, so that it is positioned within the stream of the cold air. The arrangement of the power supply unit in the area of the rear panel of the fan tray may be useful, for example, as it may minimally obstruct the stream of the cooling air. If the power supply unit features a housing in the shape of a narrow rectangular block, it may be appropriate to align the power supply unit with one longitudinal side parallel to the rear panel of the fan tray. In some embodiments, it may be especially advantageous if the housing of the power supply unit is attached to the rear panel of the fan tray. The power supply unit can accordingly form a part of the air flow for the cooling air or a built-in part of the separating element between the air intake chamber and the air outlet chamber.

In some embodiments, the power supply unit itself can include a small electric fan (e.g., as built into the housing).

With this configuration, and with the power supply unit forming a built-in part of the fan tray, it may appropriate to arrange the power supply unit in such a way that the air stream of the built-in electric fan runs parallel to the main air flow of the cooling air that streams into the air intake chamber. The main and auxiliary air stream can accordingly be directed into substantially the same direction and thereby complement or amplify each other. Further, for example, should there be a failure of one or even of all the fans of the fan tray, the separate self-cooling of the power supply can be maintained and can, to a certain extent, serve as an emergency cooling for the electronics boards. Similarly, for example, a failure of the self-cooling of the power supply can be at least partially compensated by means of the cooling air stream through the air intake chamber, which can thereby increase protection against the effects of system malfunction.

Different configurations may be possible, depending on the particular installation space. For example, for taller subracks that have an installation space for a larger number of electronic circuit boards, it may be possible to provide fan trays with integrated power supply units above as well as below the installation space for electronic cards. In some embodiments, the air intake openings of the two (or more) fan trays can accordingly be appropriately positioned on the same side of the subrack (e.g., at the front). Correspondingly, for example, exhaust from the two (or more) fan trays can also be positioned on a shared side of the subrack. For example, the two (or more) fan trays can blow out the heated air on an opposing side of the subrack, as compared to the intake (e.g., at exhausts on the rear panel).

Figure 1:
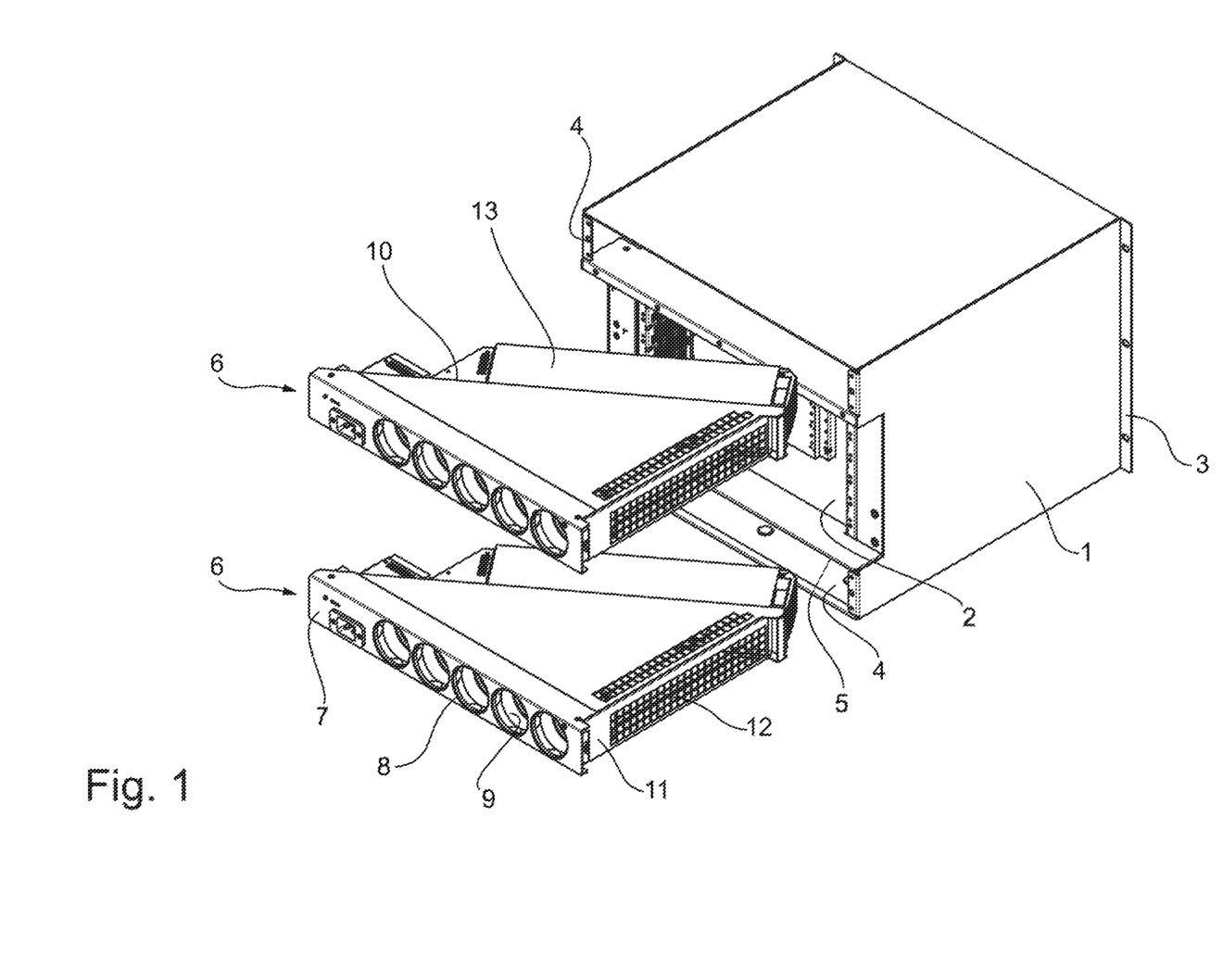
FIG. 1 is an isometric view of a subrack according to one embodiment of the invention, from a rear perspective, with two pulled out fan trays.

An example subrack according to the invention is shown in FIG. 1 is configured to provide an ATCA system with a subrack 1 that surrounds, on all sides, an installation space 2 for standardized electronic circuit boards. Mounting flanges 3, which generally extend towards the outside in a mirror-inverted way at the front of the subrack 1, can be used for the mounting the subrack 1 in a 19-inch rack or in a 23-inch Telecom shelf. The cards or circuit boards (not shown) with active electronic components can generally be inserted horizontally into the installation space 2, such that the subrack 1 may generally be referred to a horizontal subrack.

Generally, subracks can includes slots to receive fan trays. For example, in the embodiment illustrated, a slot 4 is arranged above and below the installation space 2, respectively. The slots 4 are generally bounded on most sides, but open on a least one side to receive the fan trays. For example, the horizontal slot bottom 5 of the slots 4 can generally bound the sides of the slots 4 as well as limit the installation space 2, towards the upper or lower side of the installation space 2, respectively. Similarly, the cover and the bottom of the subrack 1 can enclose (e.g., seal) the slots 4 towards the upper or lower side, respectively. In contrast, the slots 4 are generally open towards the rear panel of subrack 1.

Generally, in order to control cooling of the subrack 1, subrack assemblies such as fan trays 6 can be inserted into each of the open slots 4. In FIG. 1, two substantially identical instances of the fan tray 6 are illustrated as pulled out, in alignment for insertion into the respective slot 4. In their inserted configuration, the fan trays 6 are generally positioned within the slots 4, with, for example, the front sides 7 of the fan trays 6 are flush with the rear panel of subrack 1.

Generally, a fan tray can be configured to enclose an interior area for interior air flow, as well as to define an area for exterior air flow (e.g., in combination with other structures, such as walls of the relevant subrack). In the embodiment illustrated, for example, the fan trays 6 are designed as essentially closed cassettes (e.g., as may be formed from sheet metal) and generally feature a layout in the form of a right-angled triangle. The hypotenuse of this triangle is formed by the rear panel 10 of the fan tray 6, and legs are formed by a side panel 11 and the front side 7.

A fan tray can also generally include various ports or other openings for air flow. In the embodiment illustrated, for example, the side panels 11 feature relatively large rectangular, grated air intakes 12, through which the cooling air can flow into (or from) the installation space 2. Five respective air outlet openings 8 are arranged within the front sides 7 of the fan trays 6, behind each of which a respective fan 9 is located. In other embodiments, different numbers, sizes, or shapes of air outlet (or inlet) openings are possible.

In some embodiments, a power supply can be included as an integral part of a particular fan tray (e.g., can be connected to other structures so that it can be inserted and removed from a slot as part of the relevant fan tray). In the embodiment illustrated, for example, a respective power supply unit 13 is attached on the outside of the rear panels 10 of the fan trays 6. The power supply unit 13 accordingly forms an integral part of the associated fan tray 6 and thus can be inserted and removed from the slots 4 simultaneously, and integrally, with the respective fan tray 6.

In different embodiments, a power supply unit can exhibit different characteristics. For example, in the embodiment illustrated, the power supply unit 13 has a housing in the shape of a narrow rectangular block, with its elongate side extending substantially in parallel with the rear panel 10 of the associated fan tray 6.

Figure 2A:
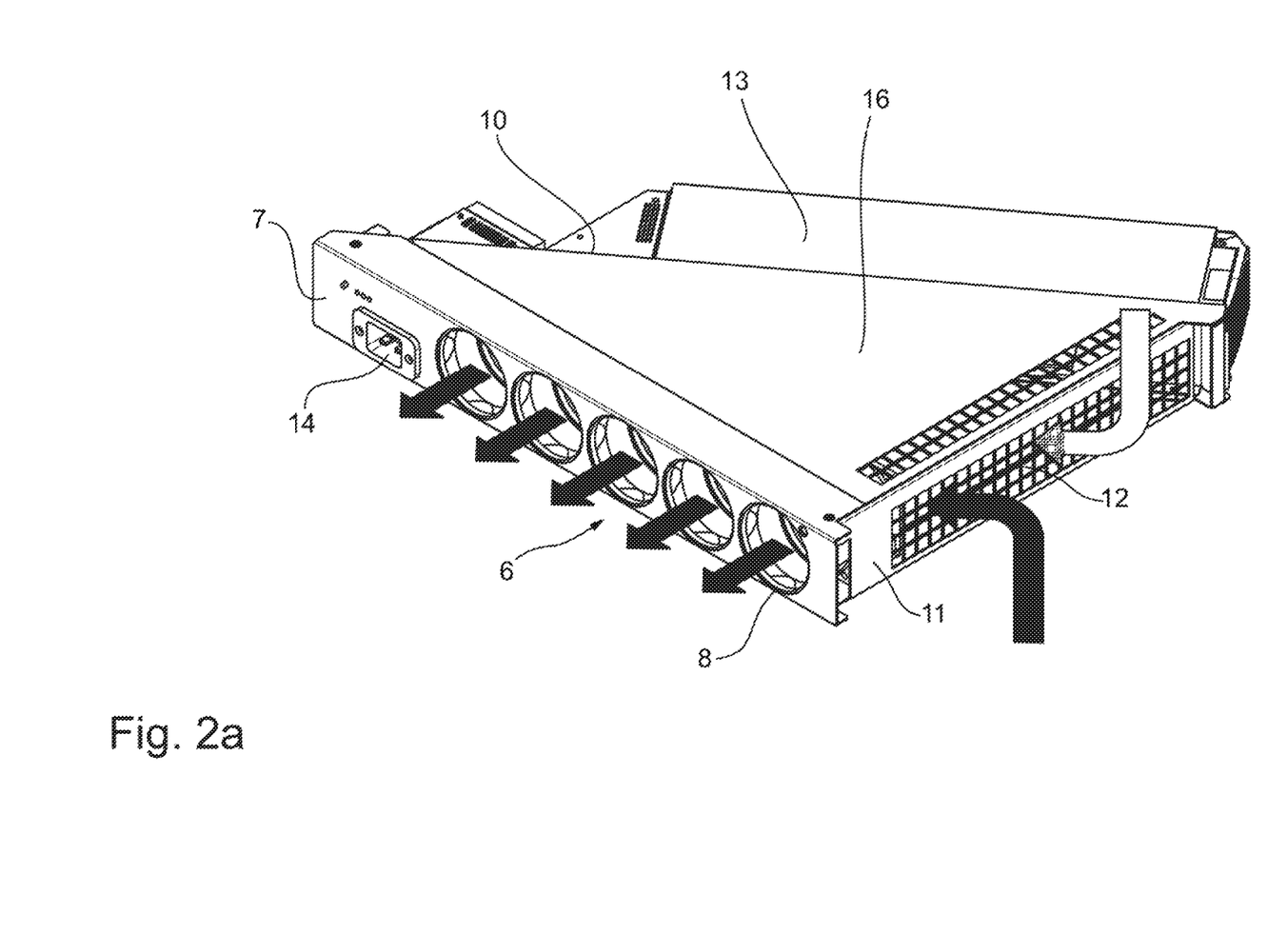
FIG. 2a is an enlarged isometric view of one of the fan trays of FIG. 1, with a cover plate and a built-in power supply unit.
Figure 2B:
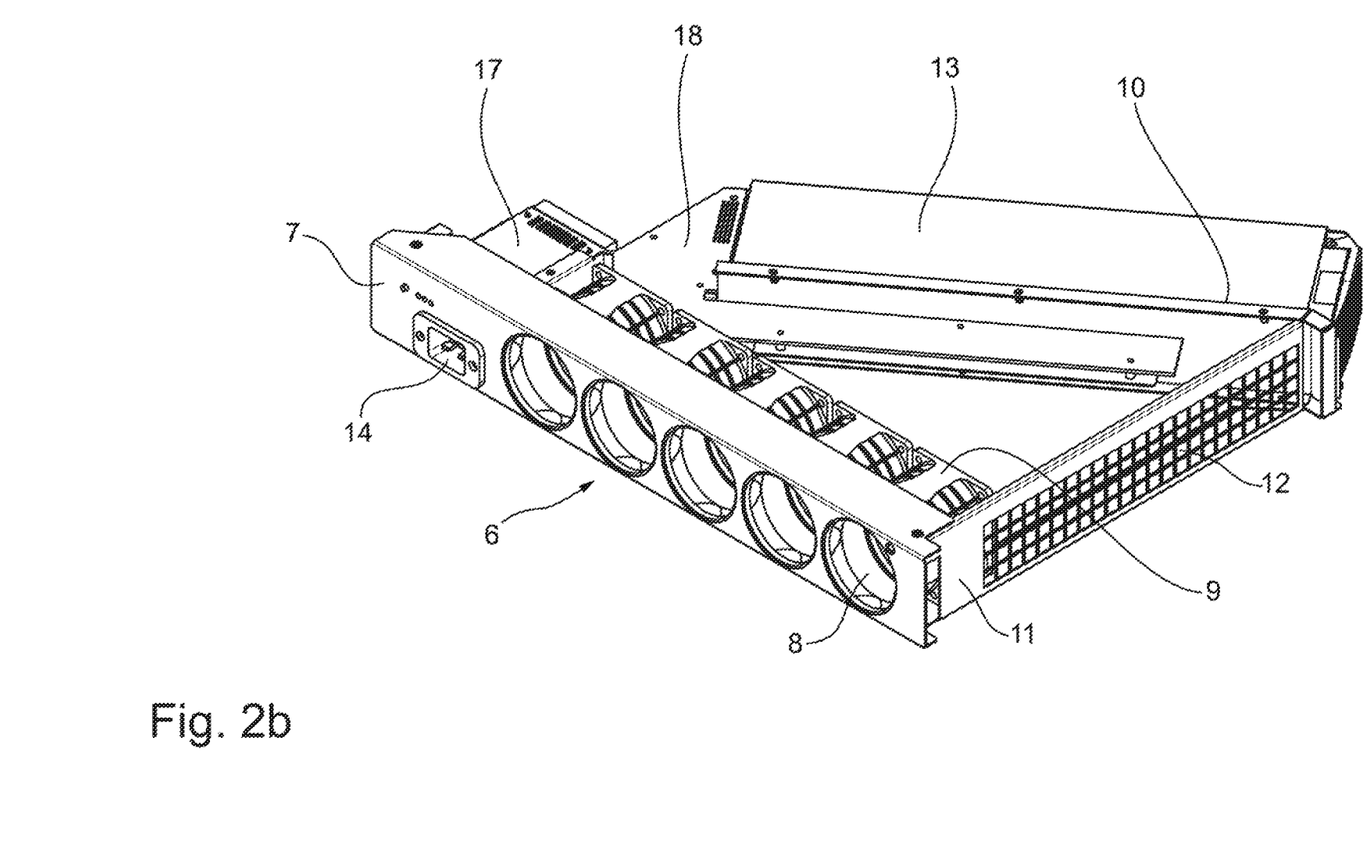
FIG. 2b is an isometric view of the fan tray of FIG. 2a, without the cover plate.

The FIGS. 2a and 2b depict further details of the fan trays 6 with the attached power supply unit 13. In FIG. 2b, the triangular cover plate 16 of fan tray 6 is detached to illustrate certain internal arrangements of the fan tray 6. For example, as illustrated in FIG. 2b, the fans 9 that are arranged behind the respective air outlet openings 8 can be axial fans, which can create a local pressure decrease that pulls cold air into the subrack 1 and through the installation space 2, to be exhausted, as heated up air, through the air outlet openings 8 into the environment.

In some embodiments, in addition to the round air outlet openings 8, a power connection 14 is arranged at the front side 7. For example, as illustrated in FIGS. 2a and 2b, a compact electronic control unit 17 can positioned behind the power connector 14. In the embodiment illustrated, a control circuit board 18 is also arranged in the area of rear panel 10, as may contain further electronic modules for the control and monitoring of the system.

Figure 3A:
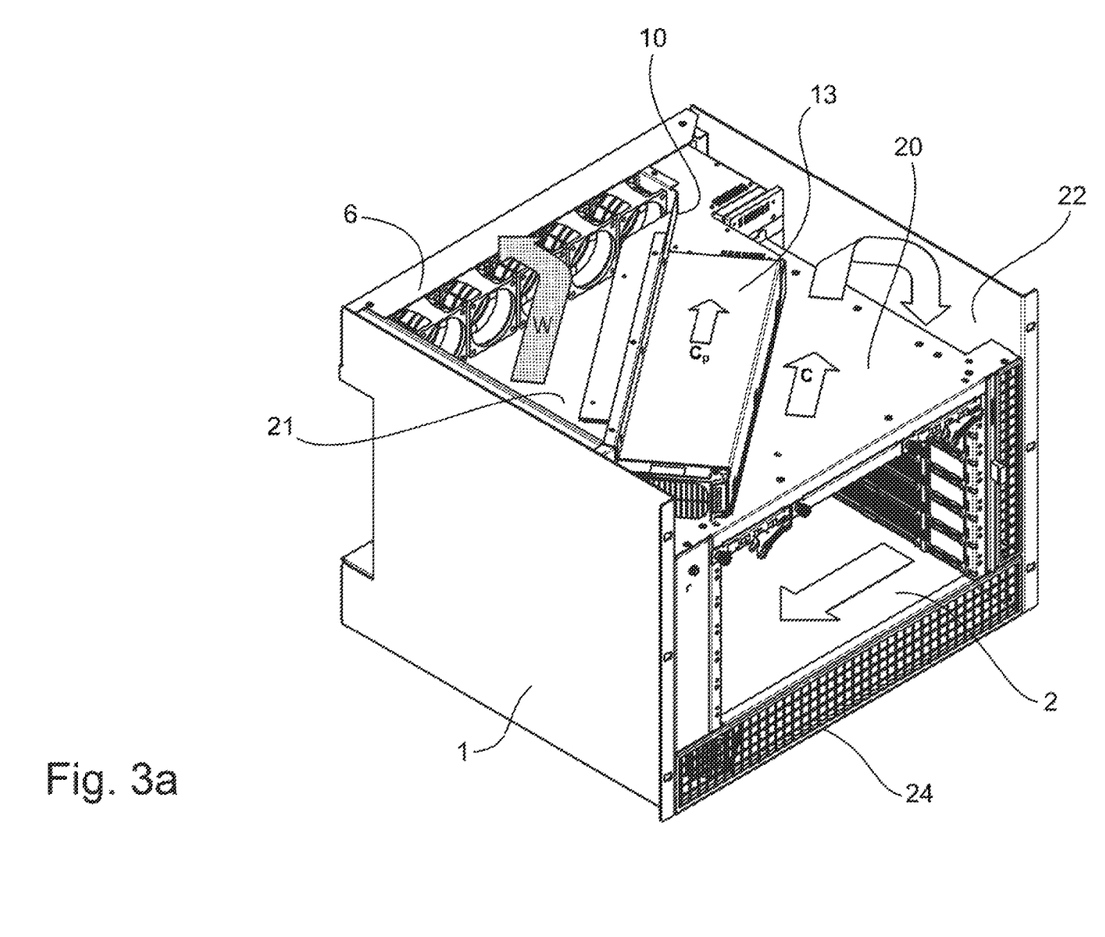
FIG. 3a is an isometric view of the subrack of FIG. 1, from a left perspective, in a partially opened configuration and with the fan trays inserted.
Figure 3B:
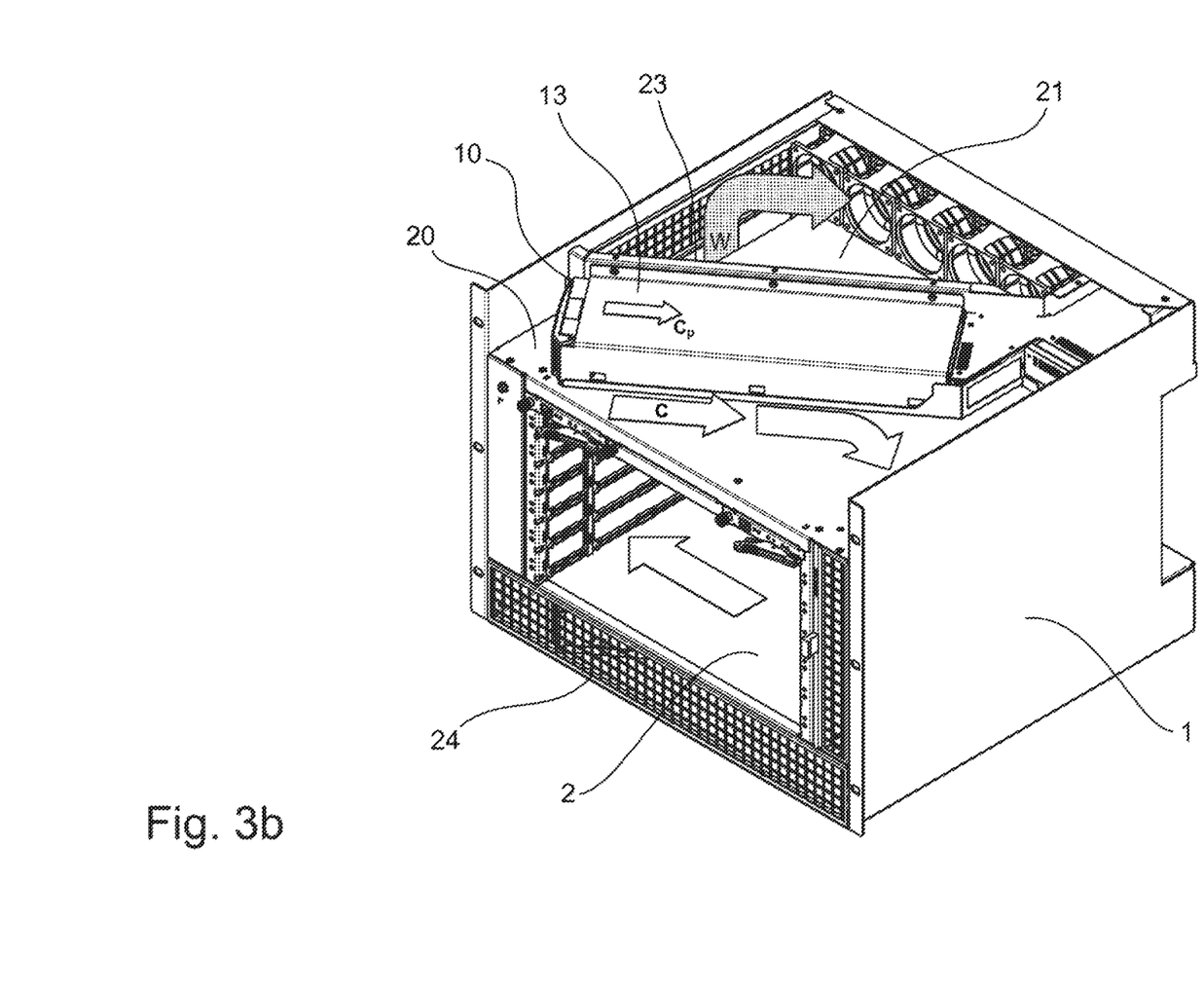
FIG. 3b is an isometric view of the subrack of FIG. 1, from a right perspective.

In the depictions of the FIGS. 3a and 3b, the fan trays 6 are inserted into the slots 4 of subrack 1. FIGS. 3a and 3b also illustrate example flow paths for sucked-in cooling air to flow through the inside of the subrack 1, in order to effectively dissipate the waste heat from the installation space 2. Generally, a fan tray according to the invention can define (alone or in combination with other components) an air intake chamber and an air outlet chamber, with the relevant subrack defining a flow path between the two that allows cool air from the air intake chamber to flow past relevant electronics to be heated, then be exhausted from the system via the air outlet chamber.

In some embodiments, an air intake chamber may be defined generally externally to a fan tray, an air outlet chamber may be defined generally internally to the fan tray, and a flow path connecting the two may extend along the sides of, and through, the relevant installation space. In the embodiment illustrated, for example, the rear panel 10 of the fan tray, with the mounted power supply unit 13, effectively serves as an airtight dividing element between an air intake chamber 20 and an air outlet chamber 21, with the bounds of the air intake chamber being further defined by certain walls of the subrack 1. Extending along a side of the subrack 1, adjacent to the installation space 2, is a vertical air distribution duct 22, which connects the air intake chamber 20 with the installation space 2. Further, as illustrated in FIG. 3b, an air collecting duct 23 extends along the opposite side of the installation space 2, to connect the installation space 2 with the air outlet chamber 21.

In this way, for example, cold air C is drawn into the subrack 1 at the air intake chamber 20, due to the low pressure area created by the fans 9, via intake openings (not shown) on the front of subrack 1 into the air intake chamber 20. The inlet stream of the cold air C then flows generally downwards (or upwards) through the vertical air distribution duct 22, to be guided into the installation space 2 (e.g., after being deflected by a 90 degree angle), in order to sweep past the electronics (not shown) within the installation space 2 (e.g., electronic circuit boards). The resulting heated-up air is then directed through the air collecting duct 23 (e.g., on the other side of the installation space 2) to reach (and e.g., accumulate in) the air outlet chamber 21 as hot waste air W. From the air outlet chamber 21, the hot waste air W is then blown out through the air outlet openings 8 on the rear panel of subrack 1.

In some embodiments, an additional fan tray can be included (e.g., on an opposite side of the relevant installation space) to provide further cooling. For example, in the illustrated embodiment, the second fan slot 4 (see FIG. 1) is disposed generally below the installation space 2, behind an air grille 24 (see FIG. 3a). The air intake chamber 20 of the lower fan tray 6 (not shown), which can draw air inflow through the air grille 24, can be connected to the same (or another) air intake chamber 22 as the air intake chamber 20 of the upper fan tray 6, as well as to the same (or another) air collecting duct 23. In some embodiments, the air streams of both fan trays 6 can accordingly be combined into to one common cooling airflow through the installation space 2, with the resulting hot waste air W being divided between the two fan trays 6 to be exhausted from the system.

In some embodiments, the configuration of a power supply unit can usefully contribute to air flow through the relevant subrack. For example, with a power supply unit disposed in a cooling-air flow path and with the power supply unit including its own cooling fan, the air flow of the power supply unit cooling fan can supplement (or at least partially replace) the air flow driven by the fans of the relevant fan tray(s). In the illustrated embodiment, for example, the power supply unit 13 is disposed with an elongate direction substantially parallel to the main air stream through the relevant air intake chamber. Accordingly, when appropriately configured, a built-in cooling fan of the power supply unit 13 can produce a secondary (e.g., relatively small) air stream $C_p$, which flows generally in parallel to the main air stream of the cold air C that is flowing into the air intake chamber 20. Accordingly, for example, the secondary air stream $C_p$ can supplement the flow of the cold air C as primarily driven by the fans 9 (see FIG. 2b), or even at least partly replace that flow (e.g., upon malfunction of one or more of the fans 9).

In the embodiment illustrated, the subrack 1 receives two of the fan trays 6, each substantially identical to the other, with one of the fan trays 6 above the installation space 2 and one of the fan trays 6 below the installation space 2, and with similar air flow paths into and out both of the fan trays 6. In other embodiments, other configurations are possible. For example, in other embodiments, different numbers of fan trays, or different mounting locations are possible. Similarly, in some embodiments, a fan tray on one side of the installation space 2 may exhibit a different geometry or other characteristic than a fan tray on another side of the installation space 2. Similarly, in some embodiments, different air flow paths within the assembly are possible (e.g., with regard to flow paths to and from the installation space, into and out of the fan trays and/or the assembly as a whole, and so on).

To guide review of the illustrated example embodiment, the following list of reference numbers is provided:

1 Subrack;
2 Installation apace;
3 Mounting flange;
4 Slot;
5 Slot bottom (of 1);
6 Fan tray;
7 Front side (of 6);
8 Air intake openings (in 7);
9 Fan;
10 Rear panel (of 6);
11 Side panel (of 6);
12 Air intake (in 11);
13 Power supply unit (PSU);
14 Power connection;
16 Cover plate (of 6);
17 Control unit;
18 Control circuit board;
20 Air intake chamber;
21 Air outlet chamber;
22 Air distribution duct;
23 Air collection duct;
24 Air grille;
C Incoming cold air;
W Hot waste air It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the following claims.

The invention claimed is:

1. A subrack assembly for use with a subrack with an installation space for electronic circuit boards, the subrack including an air distribution duct, an air collecting duct separate from the air distribution duct, and at least one slot, the subrack assembly comprising:
   at least one fan tray that includes one or more electric fans and is configured to be inserted into a corresponding one of the at least one slot of the subrack; and
   at least one power supply unit, which supplies at least one of the electronic circuit boards and the one or more electric fans with electrical energy, the at least one power supply unit forming an integral part of the fan tray;

the at least one fan tray, when inserted into the slot, at least partly defining an air intake chamber to receive air from outside the subrack assembly and an air outlet chamber to exhaust the air;

the air intake chamber being in fluid communication with the air distribution duct to direct the air towards the electronic circuit boards, to be heated; and the air outlet chamber being in fluid communication with the air collecting duct in order to dissipate the heated air;

the fan tray being configured with a layout substantially forming a right-angled triangle with a hypotenuse; and the fan tray including a rear panel that separates the air intake chamber from the air outlet chamber and forms the hypotenuse of the right-angled triangle.

2. The subrack assembly according to claim 1, wherein the fan tray substantially encloses an internal area that includes the air outlet chamber; and wherein the air intake chamber is outside the internal area.

3. The subrack assembly according to claim 2, wherein internal walls of the air intake chamber are defined at least in part by the at least one fan tray and the subrack.

4. The subrack assembly according to claim 1, wherein the power supply unit extends at least partly into the air outlet chamber.

5. The subrack assembly according to claim 4, wherein a housing of the power supply unit is attached to the rear panel.

6. The subrack assembly according to claim 5, wherein the housing of the power supply unit is attached to the rear panel opposite the air outlet chamber.

7. The subrack assembly according to claim 6, wherein the housing of the power supply unit includes a rectangular block, with an elongate side extending substantially in parallel with the rear panel of the fan tray.

8. The subrack assembly according to claim 1, wherein tire power supply unit is disposed at least partly within the air intake chamber, so that the power supply unit is disposed, within the air intake chamber, at least partly within a stream of the air from outside the subrack assembly.

9. The subrack assembly according to claim 8, wherein the power supply unit includes a built-in electric fan configured to direct an air stream within the air intake chamber that is substantially in parallel with a stream of the air from outside the subrack assembly.

10. The subrack assembly according to claim 1, wherein the at least one slot of the subrack includes a first slot above the installation space and a second slot below the installation space; and wherein a first instance of the at least one fan tray is configured to be installed in the first slot to exhaust air via a first air outlet opening;

wherein a second instance of the at least one fan tray, is configured to be installed in the second slot to exhaust air via a second air outlet opening; and wherein the first and second slots open on the same side of the subrack.

11. A subrack assembly for electronic circuit boards, the subrack assembly comprising:

a subrack that encloses an installation space for the electronic circuit boards, the subrack including:
at least one slot separated from the installation space;
at least one air distribution duct in fluid communication with the at least one slot; and
at least one air collecting duct in fluid communication with the at least one slot;

at least one fan tray configured to be slidably received in the at least one slot, each of the at least one fan trays including one or more electric fans and a rear panel that at least partly defines a first air chamber in an internal area of the at least one fan tray; and a power supply unit secured to the at least one fan tray;

the rear panel, when the at least one fan tray is slidably received in the at least one slot, defining, in cooperation with the subrack, a second air chamber outside of the at least one fan tray;

the one or more electric fans being thereby disposed to drive an air flow along a flow-path through the second air chamber, the at least one air distribution duct, the at least one air collecting duct, and the first air chamber, to cool the electronic circuit boards within the installation space; and the power supply unit extending at least partly into the second air chamber.

12. The subrack assembly of claim 11, wherein the first air chamber is an air outlet chamber;

wherein the second air chamber is an air intake chamber; and wherein the one or more electric fans are configured to drive the air flow, in sequence, from the environment, through an air inlet of the subrack into the air intake chamber, through the at least one air distribution duct to the installation space, from the installation space through the at least one air collecting duct to the air outlet chamber, and from the air outlet chamber to the environment.

13. The subrack assembly of claim 11, wherein the at least one fan tray is configured with a layout that substantially forms a right-angled triangle with a hypotenuse; and wherein the rear panel extends at least partly along the hypotenuse.

14. The subrack assembly of claim 11, wherein the power supply unit includes an electric fan configured to direct an air stream, within the second air chamber, substantially in parallel with the air flow driven by the one or more electric fans of the at least one fan tray.

15. A subrack assembly for use with a subrack that includes an installation space for electronic circuit boards, an air distribution duct, an air collecting duct separate from the air distribution duct, and a slot, the subrack assembly comprising:

a fan tray that includes:
a front side;
a rear panel; and
a side panel;

one or more electric fans supported by the fan tray; and a power supply unit secured to the rear panel;

the fan tray being configured to be slidably and removably received in the slot;

the front side, the rear panel, and the side panel at least partly defining a first air chamber within the fan tray;

the rear panel, in cooperation with the subrack, defining a second air chamber within the subrack, with the rear panel separating the second air chamber from the first air chamber;

the one or more electric fans being configured to drive an air flow through the first and second air chambers, the air collecting duct, and the air distribution duct, to cool the electronic circuit boards within the installation space; and the power supply unit extending at least partly into the second air chamber.

16. The subrack assembly of claim 15, with the subrack including an air inlet in fluid communication with the second air chamber, wherein the second air chamber is an air intake chamber;

wherein the first air chamber is an air outlet chamber; and wherein the one or more electric fans are configured to drive the air flow, in sequence, from the environment, through the air inlet of the subrack into the air intake chamber, through the air distribution duct to the installation space, from the installation space through the air collecting duct to the air outlet chamber, and from the air outlet chamber to the environment.

17. The subrack assembly of claim 15, wherein the power supply unit includes an electric fan configured to direct an air stream, within the second air chamber, substantially in parallel with the air flow driven by the one or more electric fans supported by the fan tray.

18. The subrack assembly of claim 11, wherein a housing of the power supply unit is attached to the rear panel.

19. The subrack assembly of claim 15, wherein the fan tray is configured with a layout substantially forming a right-angled triangle with a hypotenuse; and wherein the rear panel forms the hypotenuse of the right-angled triangle.

20. The subrack assembly of claim 15, wherein the fan tray is configured as a closed cassette that includes one or more electric fans.

* * * * *

UNITED STATES PATENT AND TRADEMARK OFFICE
CERTIFICATE OF CORRECTION

PATENT NO. : 10,492,336 B2  
APPLICATION NO. : 15/729429  
DATED : November 26, 2019  
INVENTOR(S) : Dietmar Mann, Oliver Kistner and Heinz Euchner Page 1 of 1

It is certified that error appears in the above-identified patent and that said Letters Patent is hereby corrected as shown below:

On the Title Page

(73) Assignee: "Schoff GmbH" should be --Schroff GmbH--

Signed and Sealed this
Fourth Day of February, 2020

Andrei Iancu
*Director of the United States Patent and Trademark Office*